United States Patent
Ahn et al.

(10) Patent No.: US 12,261,722 B2
(45) Date of Patent: Mar. 25, 2025

(54) METHOD OF PROCESSING COMPRESSED SENSING SIGNAL AND APPARATUS THEREOF

(71) Applicant: AGENCY FOR DEFENSE DEVELOPMENT, Daejeon (KR)

(72) Inventors: Jun Il Ahn, Daejeon (KR); Sung Jin Jo, Daejeon (KR); Chang Hun Lee, Daejeon (KR); Sun Phil Nah, Daejeon (KR)

(73) Assignee: AGENCY FOR DEFENCE DEVELOPMENT, Daejeon (KR)

( * ) Notice: Subject to any disclaimer, the term of this patent is extended or adjusted under 35 U.S.C. 154(b) by 106 days.

(21) Appl. No.: 18/089,698

(22) Filed: Dec. 28, 2022

(65) Prior Publication Data
US 2023/0388156 A1    Nov. 30, 2023

(30) Foreign Application Priority Data
May 31, 2022   (KR) .......................... 10-2022-0066924

(51) Int. Cl.
*H04L 25/02* (2006.01)
*H04L 25/03* (2006.01)

(52) U.S. Cl.
CPC .... *H04L 25/0242* (2013.01); *H04L 25/03872* (2013.01)

(58) Field of Classification Search
CPC .......... H04L 25/0242; H04L 25/03872; H04L 25/0246; H04L 27/0002; H04B 17/0085; H04B 17/21; H04B 17/26; G01R 23/16; G01R 23/165; G01R 23/15; G01R 23/20
See application file for complete search history.

(56) References Cited

U.S. PATENT DOCUMENTS 11,271,587 B2    3/2022  Tseng
2017/0228096 A1*  8/2017  Nathan ............. G06F 3/041661
2021/0297098 A1*  9/2021  Haque ...................... H04B 1/10

FOREIGN PATENT DOCUMENTS

| KR | 101921097 B1 | 2/2019 |
| KR | 10-2119486 B1 | 6/2020 |
| KR | 102135336 B1 | 7/2020 |

OTHER PUBLICATIONS

English translation of KR102119486B1 (Year: 2020).*
English translation of KR102135336B1 (Year: 2020).*
Notice of Reasons for Rejection w/English translation issued May 10, 2024 in corresponding Korean Application No. 10-2022-0066924.

* cited by examiner

*Primary Examiner* — Sam K Ahn
*Assistant Examiner* — Amneet Singh
(74) *Attorney, Agent, or Firm* — MILES & STOCKBRIDGE P.C.

(57) ABSTRACT

A method of processing a signal in a compressive sensing receiver, includes: obtaining a first signal received via an antenna; generating a first baseband signal by mixing the first signal with a second signal generated by a local oscillator based on a pseudo random binary sequence (PRBS); removing a spurious from the first baseband signal based on a pre-stored estimation value obtained by estimating the spurious generated by the local oscillator in advance; and detecting a spectral slice including the first signal based on the first baseband signal from which the spurious is removed and a measurement matrix.

11 Claims, 8 Drawing Sheets

METHOD OF PROCESSING COMPRESSED SENSING SIGNAL AND APPARATUS THEREOF

PRIORITY INFORMATION

This disclosure claims the benefit of the Korean Patent Application No. 10-2022-0066924, filed on May 31, 2022, which is hereby incorporated by reference in its entirety.

FIELD OF THE INVENTION

Example embodiments of the present disclosure relate to a method of processing a compressed sensing signal and an apparatus thereof, and more particularly, to a method and apparatus in which a spurious is removed and a measurement matrix is calibrated for a normal operation of a compressive sensing receiver.

DISCUSSION OF THE RELATED ART

A compressive sensing receiver mixes a large number of signals presenting in a broadband and signal generated by a local oscillator (LO) based on a pseudo random binary sequency (PRBS), compresses such a mixed signal in a baseband, and detects a spectral slice including an original signal using a result obtained by multiplying a measurement matrix composed of Fourier Transform coefficients for the signals generated by the local oscillator by compressed signals.

In this case, in a computer simulation, the detection of the spectral slice based on the measurement matrix is normally operated. However, theoretical measurement matrix may not operate normally due to matters that a spurious generated by a cross modulation of signals generated by a plurality of local oscillators included in the compressive sensing receiver is mixed with a signal compressed in the baseband, and the influence of components that non-linearly operate in the reception apparatus. This may degrade the accuracy of the spectral slice detection. Therefore, there is a need for a signal processing technique which is capable of efficiently removing a spurious generated by a local oscillator based on a pseudo random binary sequence and properly calibrating a measurement matrix used for recovery of a received signal through the removal of the spurious.

SUMMARY OF THE INVENTION

Accordingly, the embodiments of the present disclosure are directed to systems, devices, methods, and instructions for processing compressed sensing signal that substantially obviate one or more problems due to limitations and disadvantages of the related art.

The present disclosure is directed to providing a signal processing method which is capable of removing a spurious generated due to a cross modulation of signals of a plurality of local oscillators so as to constitute a measurement matrix which calibrates the influence of non-linearly operating components, and a compressive sensing receiver used for the signal processing method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present disclosure, as embodied and broadly described, there is provided systems, devices, methods, and instructions for processing a signal in a compressive sensing receiver, which may include: obtaining a first signal received via an antenna; generating a first baseband signal by mixing the first signal with a second signal generated by a local oscillator based on a pseudo random binary sequence (PRBS); removing a spurious from the first baseband signal based on a value which is obtained by estimating the spurious generated by the local oscillator and is stored in advance; and detecting a spectral slice including the first signal based on the first baseband signal from which the spurious is removed and a measurement matrix.

According to an aspect, the first signal may include a plurality of radio-frequency (RF) signals, and the value may be a spurious average value obtained by estimating spuriouses generated by the local oscillator and calculating an average thereof. The generating the first baseband signal may include: mixing the first signal with the second signal; and generating the first baseband signal by filtering the mixed signal using a low-pass filter.

According to an aspect, the method may further include calibrating the measurement matrix using a calibration signal generated based on a bit pattern length of the pseudo random binary sequence and a reception frequency band.

According to an aspect, the calibrating the measurement matrix may include: mixing the calibration signal with the second signal to generate a second baseband signal; sampling the second baseband signal; filtering the sampled second baseband signal with a finite impulse response filter and performing a Fast Fourier transform on the filtered sampled second baseband signal; removing the spurious from the transformed second baseband signal based on the stored spurious average value; performing the Fast Fourier transform on the second baseband signal from which the spurious is removed; extracting a signal of a frequency band in which the calibration signal is included from the second baseband signal subjected to the Fast Fourier transform; and calibrating the measurement matrix based on a result obtained by decomposing a singular value from the extracted signal.

According to an aspect, the detecting the spectral slice may include detecting the spectral slice based on the first baseband signal from which the spurious is removed and the calibrated measurement matrix.

According to an aspect, the extracting the signal of the frequency band in which the calibration signal is included, may include extracting a signal of a frequency band that is shifted by a preset offset from a central frequency of each of bands obtained by dividing a reception frequency band for the first signal by a predetermined bit pattern length of the pseudo random binary sequence.

According to another aspect, there is provided a compressive sensing receiver for processing a signal, which may include: a receiver configured to obtain a first signal received via an antenna; a memory storing a spurious estimation value and a measurement matrix; and at least one processor configured to perform: generating a first baseband signal by mixing the first signal with a second signal generated by a local oscillator based on a pseudo random binary sequence; removing a spurious from the first baseband signal based on the spurious estimation value which is obtained by estimating the spurious generated by the local oscillator and is stored in advance; and detecting a spectral slice including the first signal based on the first baseband signal from which the spurious is removed and the measurement matrix.

According to another aspect, the first signal received by the receiver may include a plurality of radio frequency (RF) signals, the spurious estimation value may be a spurious average value obtained by estimating spuriouses generated by the local oscillator and calculating an average thereof, and the at least one processor may be configured to perform: mixing the first signal with the second signal; and generating the first baseband signal by filtering the mixed signal using a low-pass filter.

According to another aspect, the at least one processor may be further configured to calibrate the measurement matrix using a calibration signal generated based on a bit pattern length of the pseudo random binary sequence and a reception frequency band.

According to another aspect, the at least one processor may be configured to perform: mixing the calibration signal with the second signal to generate a second baseband signal; sampling the second baseband signal; filtering the sampled second baseband signal with a finite impulse response filter and performing a Fast Fourier transform on the filtered sampled second baseband signal; removing the spurious from the transformed second baseband signal based on the stored spurious average value; performing the Fast Fourier transform on the second baseband signal from which the spurious is removed; extracting a signal of a frequency band in which the calibration signal is included from the second baseband signal subjected to the Fast Fourier transform; and calibrating the measurement matrix based on a result obtained by decomposing a singular value from the extracted signal.

According to another aspect, the at least one processor may be configured to detect the spectral slice including the first signal based on the first baseband signal from which the spurious is removed and the calibrated measurement matrix.

According to another aspect, the at least one processor may be configured to extract a signal of a frequency band that is shifted by a preset offset from a central frequency of each of bands obtained by dividing a reception frequency band for the first signal by a predetermined bit pattern length of the pseudo random binary sequence.

According to still another aspect, there is provided a non-transitory computer-readable storage medium storing instructions, wherein when the instructions are performed by at least one processor included in a compressive sensing receiver, a compressive sensing receiver is caused to execute: obtaining a first signal received via an antenna; generating a first baseband signal by mixing the first signal with a second signal generated by a local oscillator based on a pseudo random binary sequence (PRBS); removing a spurious from the first baseband signal based on a value which is obtained by estimating the spurious generated by the local oscillator and is stored in advance; and detecting a spectral slice including the first signal based on the first baseband signal from which the spurious is removed and a measurement matrix.

In a compressive sensing receiver according to an example embodiment of the present disclosure, a spurious generated by a local oscillator and mixed in a baseband of a received signal, which is hard to be removed by a low-pass filter, is removed. This enables normal operation of a theoretical measurement matrix in the compressive sensing receiver.

According to an example embodiment of the present disclosure, unlike an existing method of calibrating a measurement matrix in a baseband compressed signal in which a spurious is included, a spectral slice including a radio-frequency signal is detected in further consideration of a spurious generated by a cross modulation of signals of a plurality of local oscillators.

This improves the performance of the spectral slice detection. That is, by estimating the spurious generated by cross modulation of the signals of the local oscillators and storing the spurious estimation value in advance, it is possible to remove a spurious component from the received radio-frequency signal based on the spurious estimation value. The measurement matrix may be calibrated by a method which includes generating a test signal, converting a baseband signal reflecting the influence of non-linearly operating components into a digital signal, performing a Fast Fourier transformation, extracting a band of a calibration signal, and performing a singular value decomposition, and configuring a column vector of the measurement matrix.

Effects are not limited to the aforementioned effects, and other effects not mentioned will be clearly understood by those skilled in the art from the description of the claims.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION OF THE EXAMPLE EMBODIMENTS

Reference will now be made in detail to the example embodiments of the present disclosure, examples of which are illustrated in the accompanying drawings.

Technical contents that are well known in a technical field to which the present disclosure pertains and are not directly related to the present disclosure will be omitted in describing example embodiments. This is to more clearly describe the gist of the present disclosure by omitting unnecessary description.

Further, in the accompanying drawings, some of constituent elements are illustrated on a large scale, omitted, or schematically illustrated. In addition, the size of each constituent element does not fully reflect the actual size. In each drawing, the same or corresponding elements will be indicated by the same reference numerals.

Advantages and features of the present disclosure, and a method of achieving them, will become more apparent by example embodiments described below in detail in conjunction with the accompanying drawings. However, the present disclosure is not limited to example embodiments which will be described later, and may be implemented in various different forms.

The present example embodiments merely completely describe the present disclosure, and are provided to faithfully explain the scope of the present disclosure to those skill in the art to which the present disclosure pertains. The present disclosure is merely defined by the scope of the claims. Throughout the specification, like reference numerals refer to like constituent elements.

Further, it will also be understood that each block in process flowchart figures and combinations of the process flowchart figures may be executed by computer program instructions. These computer program instructions may be incorporated in a processor of a general-purpose computer, a special-purpose computer, or other programmable data processing equipment. The instructions, when executed by the processor of such computers or other programmable data processing equipment, may implement parts for performing functions described in the block(s) in the flowchart figures. These computer program instructions may be stored in a computer-usable or computer-readable memory that may oriented to the computer or other programmable data processing equipment to implement functions in a particular manner. Thus, the instructions stored in the computer-usable or computer-readable memory may produce a manufacture article incorporating instruction parts for performing the functions described in the block(s) of the flowchart figures. The computer program instructions may be incorporated in the computer or other programmable data processing equipment so that a series of operations are performed on the computer or other programmable data processing equipment to implement processes executed by the computer. Thus, the instructions that operate the computer or other programmable data processing equipment may also provide operations of executing the functions described in the block(s) in the flowchart figures.

In addition, each block may represent a portion of a module, segment, or code that includes one or more executable instructions for executing assigned logical function(s). Further, it should also be noted that in some alternative implementations, the functions recited in the blocks may be executed in a non-sequence manner. For example, two successive blocks may be executed substantially in parallel or may be executed in the reverse order according to their functions.

In addition, the term "part" used in this example embodiment may refer to software or a hardware constituent element such as a field-programmable gate array (FPGA) or an application specific integrated circuit (ASIC). The "part" may perform a certain role. However, the "part" is not limited to software or hardware. The "part" may be configured to be included in an addressable storage medium, or configured to reproduce one or more processors. Thus, as an example, the "part" may include constituent elements such as software constituent elements, object-oriented software constituent elements, class constituent elements and task constituent elements, processes, functions, properties, procedures, subroutines, segments of program codes, drivers, firmware, microcode, circuits, data, databases, data structures, tables, arrays, and variables. The functions provided by the constituent elements and the "parts" may be combined with a smaller number of constituent elements and "parts" or may further be divided into additional constituent elements and "parts". Besides, the constituent elements and "parts" may be implemented to play one or more CPUs in a device or security multimedia card.

When a part "comprise or includes" a constituent element through the specification, this means that the part may further include other constituent elements, rather than excluding other constituent elements, unless other stated. In addition, the terms such as "part," "module" and the like used herein may refer to a unit that performs at least one function or operation, which may be realized as hardware or software, or may be realized as a combination of hardware and software.

The expression "at least one of a, b, and c" may include the following meanings: 'a alone', 'b alone', 'c alone', 'both a and b together', 'both a and c together', 'both b and c together', or 'all three of a, b, and c together'.

In the following description, embodiments of the present disclosure will be described in detail with reference to the accompanying drawings so that those skilled in the art can easily carry out the present disclosure. The present disclosure may be embodied in many different forms and is not limited to the example embodiments described herein.

Example embodiments of the present disclosure will be described below with reference to the drawings.

Figure 1:
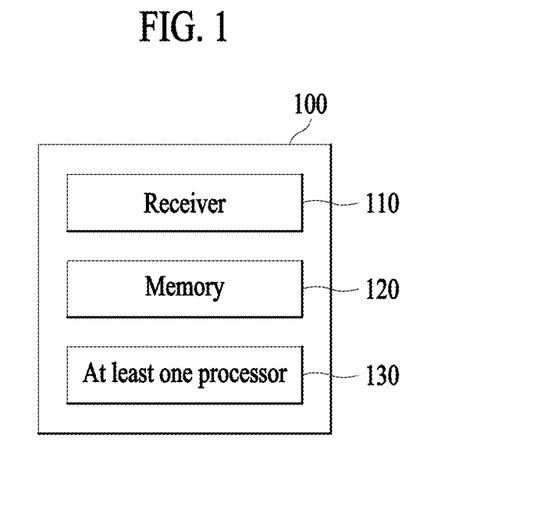
FIG. 1 is a view schematically illustrating a configuration of a compressive sensing receiver according to an example embodiment of the present disclosure.

FIG. 1 is a view schematically illustrating a configuration of a compressive sensing receiver 100 according to an example embodiment of the present disclosure.

Referring to FIG. 1, the compressive sensing receiver 100 may include a receiver 110, a memory 120, and at least one processor 130. In an example embodiment, the receiver 110 of the compressive sensing receiver 100 may be a radio-frequency (RF) receiver including an antenna. In an example embodiment, the receiver 110 of the compressive sensing receiver 100 may obtain a first signal by the receiver 110. In an example embodiment, the at least one processor 130 may mix the obtained first signal with a second signal generated from a local oscillator by a pseudo random binary sequence (PRBS) to generate a first baseband signal.

In an example embodiment, the second signal may include a spurious generated by the local oscillator by the pseudo random binary sequence. In an example embodiment, a method of mixing the first signal with the second signal may employ various methods relating to a compressed sensing reception method in the related art. In an example embodiment, the spurious generated by the local oscillator by the pseudo random binary sequency may be estimated and then removed from a first baseband signal based on a value which is obtained by estimating the spurious generated by the local oscillator and is stored in advance. A spectral slice including the first signal may be detected based on the first baseband signal from which the spurious is removed and a measurement matrix. In the compressive sensing receiver 100 illustrated in FIG. 1, constituent elements relating to the example embodiment are merely illustrated. Thus, As will be understood by those skilled in the art, in addition to the constituent elements illustrated in FIG. 1, other general-purpose constituent elements may be further included in the compressive sensing receiver 100.

The receiver 110 may obtain the first signal received through the antenna. The receiver 110 may include a constituent element for receiving a signal in a broadband radio channel environment. The first signal may have an analog signal form. The at least one processor 130 may sample the first signal according to a preset sampling frequency.

For example, the receiver 110 may receive a plurality of RF signals and deliver the same to the at least one processor 130 of the compressive sensing receiver 100.

In another example embodiment, the first signal obtained by the receiver 110 may be received in the form of pre-sampled data according to a sampling frequency of the compressed sensing. In this case, at least a portion of a sampling process described herein may be omitted.

In an example embodiment, the at least one processor 130 serves to control overall functions for the signal processing in the compressive sensing receiver 100. For example, the at least one processor 130 may execute a program stored in the memory 120 of the compressive sensing receiver 100 to control the compressive sensing receiver 100 as a whole. The at least one processor 130 may be implemented with a central processing part (CPU), a graphics processing part (GPU), an application processor (AP), or the like included in the compressive sensing receiver 100, but not limited thereto.

In an example embodiment, the at least one processor 130 may include a Channeled reception part provided in the receiver 110 and configured with a plurality of reception channels to process a received signal.

In an example embodiment, the at least one processor 130 may include a digital processing part configured to receive an output of the channeled reception part and perform the signal processing for the detection of the spectral slice that includes the first signal using the measurement matrix.

In an example embodiment, the at least one processor 130 may include a calibration signal generating part configured to generate a calibration signal for calibrating the measurement matrix to be used for the detection of the spectral slice performed by the digital processing part, and input the same to the channeled reception part.

In an example embodiment, the at least one processor 130 may include a radio-frequency front-end part configured to select one of the signals input from the calibration signal generating part and the receiver 110. In an example embodiment, the radio-frequency front-end part may further include an amplifier configured to amplify the calibration signal generated from the calibration signal generating part or the signal received from the receiver 110.

In an example embodiment, the memory 120 may be configured to store a spurious estimation value and/or the measurement matrix. Further, the memory may store applications, drivers, and the like to be driven by the compressive sensing receiver 100. The memory 120 may include a random-access memory (RAM) such as a dynamic random-access memory (DRAM), a static random-access memory (SRAM) or the like, a read-only memory (ROM), an electrically erasable programmable read-only memory (EEPROM), a compact disc read-only memory (CD-ROM), a Blu-ray or other optical disk storage, a hard disk drive (HDD), a solid-state drive (SSD), or a flash memory.

The compressive sensing receiver 100 may mix the first signal obtained by the receiver 110 with the second signal generated by the local oscillator using the pseudo random binary sequence to generate the first baseband signal. An example of a process of generating the first baseband signal described in the present disclosure will be described in detail below with reference to FIG. 3. The at least one processor 130 may perform an additional process of filtering a signal falling outside a baseband bandwidth through a low-pass filter (LPF) with respect to the first baseband signal mixed and generated as above.

A spurious may be generated due to an inter-tone cross modulation distortion of the signals of the plurality of local oscillators and a non-linear operation of a mixer. The signal deviating from the baseband bandwidth in the compressive sensing receiver 100 is filtered through the low-pass filter, but the spurious falling within the baseband bandwidth may remain. In an example embodiment, when the first signal obtained through the receiver 110 is blocked, the spurious component falling within the baseband bandwidth in the signals of the plurality of local oscillators may be output merely. Thus, the at least one processor 130 may estimate spuriouses generated by the local oscillators, store an average of values of the spuriouses in advance, and remove the spuriouses contained in the first baseband signal based on the stored average. A process of estimating and removing the spuriouses will be described in detail below with reference to FIGS. 4 to 6.

In an example embodiment, the compressive sensing receiver 100 may detect the spectral slice including the first signal based on the first baseband signal from which the spurious has been removed and the measurement matrix stored in memory 120. In an example embodiment, the at least one processor 130 may generate the calibration signal based on a bit pattern length previously set for the local oscillator by the pseudo random binary sequence and a reception frequency band for the first signal. The at least one processor 130 may use the generated calibration signal to calibrate the measurement matrix. The process of generating the calibration signal and calibrating the measurement matrix will be described in detail below with reference to FIG. 7.

Figure 2:
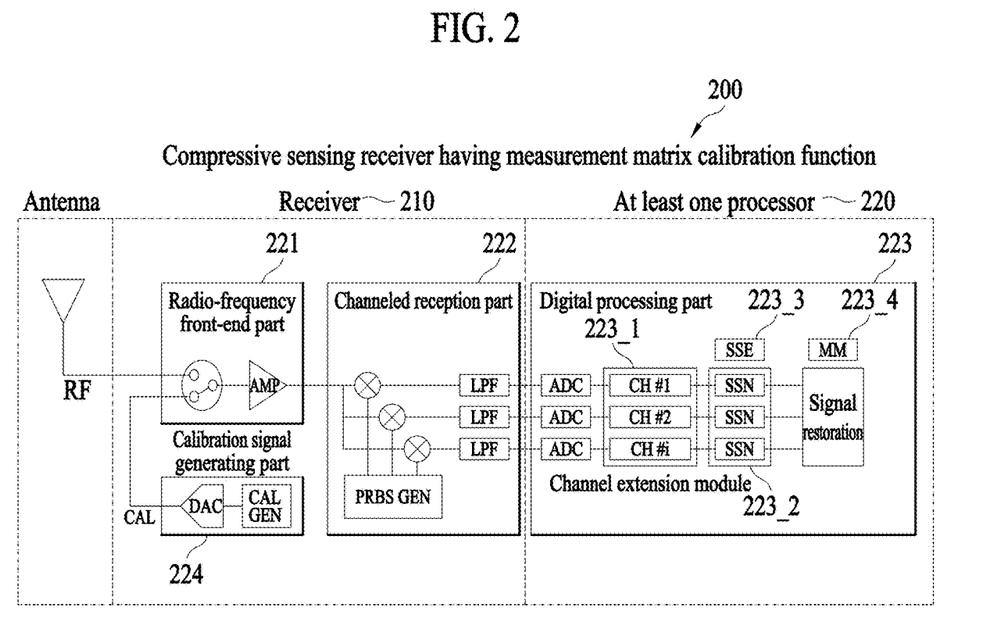
FIG. 2 illustrates the compressive sensing receiver having a spurious removal function and a measurement matrix calibration function according to an example embodiment of the present disclosure.

FIG. 2 illustrates a compressive sensing receiver 200 having a spurious removal function and a measurement matrix calibration function according to an example embodiment of the present disclosure.

Some or all of operations of the compressive sensing receiver 200 illustrated in FIG. 2 may be performed by the compressive sensing receiver 100 of FIG. 1. Referring to FIG. 2, the compressive sensing receiver 200 including a receiver 210 and at least one processor 220 is illustrated by way of example. The at least one processor 220 may include a radio-frequency front-end part 221, a channeled reception part 222, a digital processing part 223, and a calibration signal generating part 224. The digital processing part 223 may include a channel extension module 223_1, a spurious removal module (spurious signal nulling (SSN)) 223_2, a spurious estimation value storage memory (spurious signal estimator (SSE)) 223_3, and a measurement matrix storage memory (measurement matrix (MM)) 223_4.

In an example embodiment, the at least one processor 220 of FIG. 2 may correspond to the at least one processor 130 of FIG. 1.

In an example embodiment, the spurious estimation value storage memory 223_3 and the measurement matrix storage memory 223_4 of FIG. 2 are illustrated to be included in the at least one processor 220, but may be implemented as hardware provided separately from the at least one processor 220. In an example embodiment, the spurious estimation value storage memory 223_3 and the measurement matrix storage memory 223_4 of FIG. 2 may be included in the memory 120 of FIG. 1.

Referring to FIG. 2, the receiver 210 may obtain the first signal through the antenna. In an example embodiment, the received first signal may include a plurality of RF signals. In an example embodiment, the radio-frequency front-end part 221 may amplify the received first signal. In an example embodiment, the radio-frequency front-end part 221 may include a switch to select a signal to be delivered. For example, the radio-frequency front-end part 221 may include a switch configured to select a signal to be delivered.

For example, when the switch selects the first signal, the radio-frequency frontend part 221 may amplify the first signal. Alternatively, when the switch selects the calibration signal generated by the calibration signal generating part 224, the radio-frequency front-end part 221 may amplify the calibration signal. The signal amplified by the radio-frequency front-end part 221 may be delivered to the channeled reception part 222. In an example embodiment, when the output from the radio-frequency front-end part 221 is blocked, merely the second signal by the local oscillator is used in the channeled reception part 222, which enables the checking of a spurious component contained in the second signal. Details thereof will be described later.

In an example embodiment, the channeled reception part 222 may include a plurality of reception channels. The channeled reception part 222 may mix the first signal with the second signal generated by the local oscillator (for example, PRBS generator of FIG. 2) by the pseudo random binary sequency to generate the first baseband signal. In an example embodiment, the first baseband signal mixed and generated as above may be filtered by the low-pass filter (LPF). The first baseband signal filtered by the low-pass filter may be input to the digital processing part 223. The at least one processor 220 may use the digital processing part 223 of FIG. 2 to detect a spectral slice including the first signal from the first baseband signal. A process of performing the signal processing on the first baseband signal in the digital processing part 223 to which the first baseband signal is input will be also described in FIG. 4, and thus a detailed description thereof will be given later.

Figure 3:
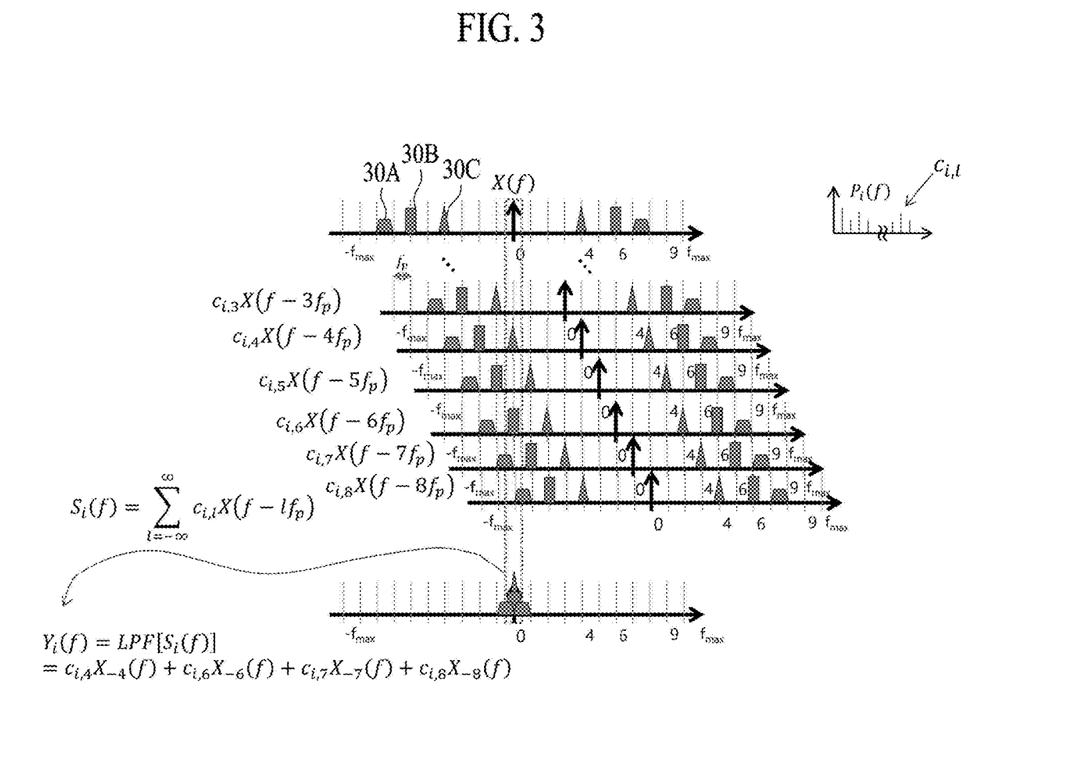
FIG. 3 is an exemplary view for explaining a process of mixing multiband signals according to an example embodiment of the present disclosure.

FIG. 3 is an exemplary view illustrating a process of maxing multi-band signals according to an example embodiment of the present disclosure.

Referring to FIG. 3, a signal x(f) has bands 30A, 30B, and 30C, and the at least one processor 130 may divide a spectrum range (from $-f_{max}$ to $f_{max}$) into a range fp. $C_{i,l}$ represents a value of a y-axis of each band at the signal x(f). As illustrated in FIG. 3, the signal x(f) may be mixed in the form of $S_i(f)=\Sigma_{l=-\infty}^{\infty} c_{i,l} X(f-lf_p)$ in the channeled reception part 222. Such a process corresponds to a process of deriving non-zero values y in the compressed sensing technique, unlike an existing Shannon-Nyquist sampling theory. The at least one processor 130 filters the mixed $S_i(f)$ using the low-pass filter to filter signals falling outside the baseband. The filtered signal has all bands in which the value y of the signal X(f) is not zero. This enables detection of a spectral slice including an original signal. For example, with regard to the signal $Y_i(f)=LPF[S_i(f)]=c_{i,4}X_{-4}(f)+c_{i,6}X_{-6}(f)+c_{i,7}X_{-7}(f)+c_{i,8}X_{-8}(f)$ that has passed through the low-pass filter in FIG. 3, the term $c_{i,4}X_{-4}(f)$ has a value of the band 30C, the term $c_{i,6}X_{-6}(f)$ has a value of the band 308, and the term $c_{i,7}X_{-7}(f)+c_{i,8}X_{-8}(f)$ has a value of the band 30A. Accordingly, since the mixed and filtered signal $Y_i(f)$ has all the values of the bands 30A, 30B and 30C are included, the compressive sensing receiver 200 may detect the spectral slice based on the mixed and filtered signal $Y_i(f)$.

Referring back to FIG. 2, in a case in which the first baseband signal is generated based on the first signal and the second signal, a spurious may be included in the second signal due to the inter-tone cross modulation distortion of the signals of the plurality of local oscillators and the non-linear operation of the mixer. Therefore, in the case in which the spectral slice containing the first signal obtained through the receiver 210 is detected based on the first baseband signal generated by mixing the second signal with the first signal, there is a problem that the detection of the spectral slice may be inevitably performed based on the baseband signal (for example, the first baseband signal) in which the spurious is also mixed. That is, the signal falling outside the baseband bandwidth of the compressive sensing receiver 200 is filtered by the low-pass filter of the channeled reception part 222, but the spurious falling within the baseband bandwidth may remain. As a result, the spurious may be transferred to the digital processing part 223 and the process of detecting the spectral slice may be performed in such a situation.

In an example embodiment, when the radio-frequency front-end part 221 blocks the first signal, the channeled reception part 222 outputs a spurious component falling within the baseband bandwidth in the signals (for example, the second signals) of the plurality of local oscillators. That is, the output of the channel extension module 223_1 of the digital processing part 223 is a digitized spurious component. In an example embodiment, the at least one processor 220 may calculate an average of the outputs of the channeled reception part 222 and store the same to the spurious estimation value storage memory 223_3 on a channel basis. A process of estimating the spurious will be described in detail below with reference to FIG. 4.

Figure 4:
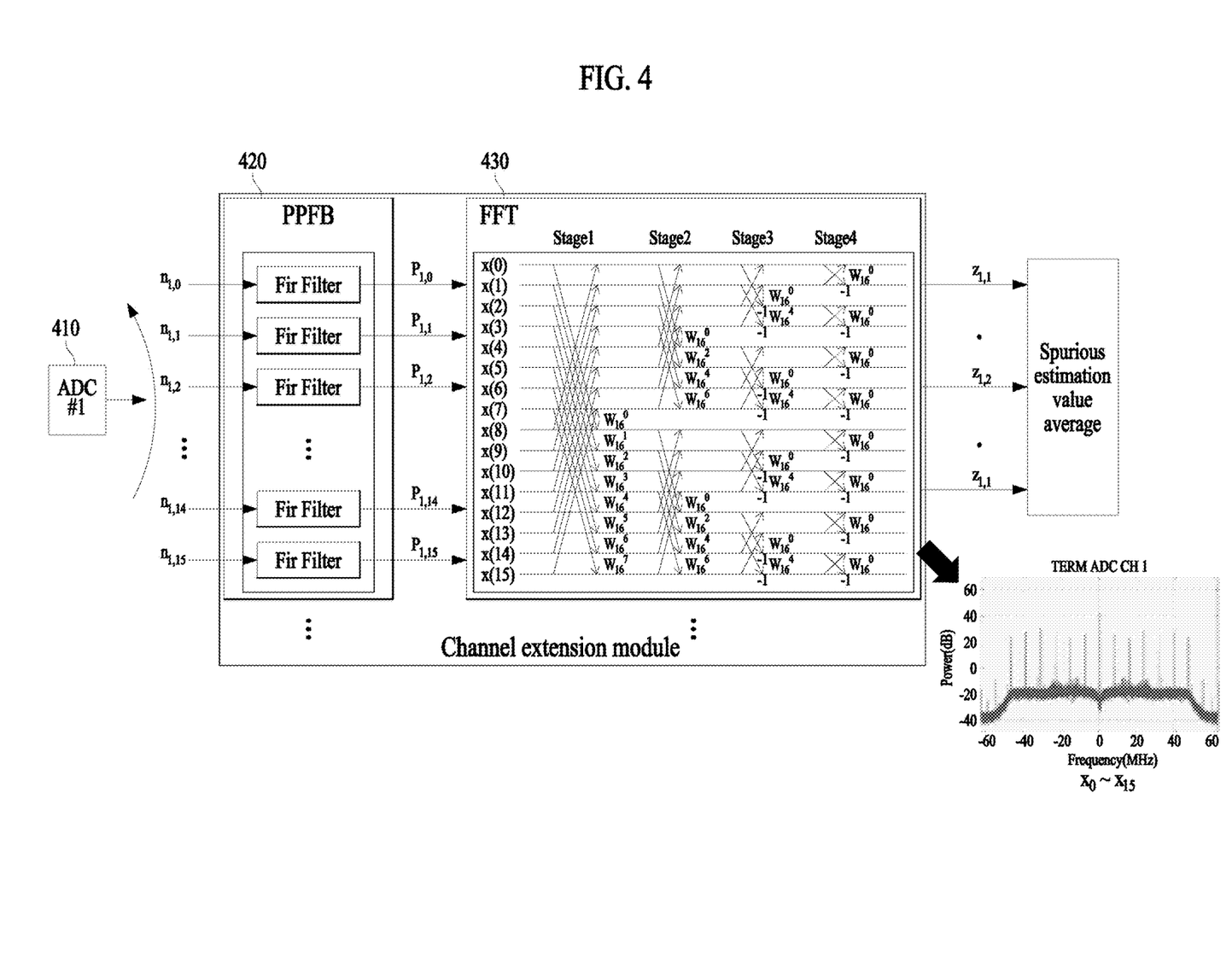
FIG. 4 is a block diagram exemplarily illustrating a channel extension module of the compressive sensing receiver of FIG. 2.

FIG. 4 is a block diagram exemplarily illustrating the channel extension module 223_1 of the compressive sensing receiver of FIG. 2.

The channel extension module 223_1 may include a polyphase filter bank (PPFB) 420 composed of 16 finite impulse response (FIR) filters per physical channel and a Fast Fourier transform (FFT) module 430 implemented with four stages. In an example embodiment, a $f_p$ in the channel extension module 223_1 may be set to 7.8125 megahertz (Mhz). In a state in which the input to the radio-frequency front-end part 221 of FIG. 2 is blocked, the output of the channeled reception part 222 may correspond to spuriouses according to a plurality of patterns of PRBSes which are the local oscillators by the pseudo random binary sequence.

In an example embodiment, the first baseband signal generated based on the first signal and the second signal may be converted into a digital signal by an analog-digital-converter (ADC) 410 of FIG. 4. The conversion of the first baseband signal into the digital signal by the ADC 410 may mean sampling the spuriouses according to the plurality of PRBS patterns at the sampling rate $f_s$. In an example embodiment, the sampling rate $f_s$ in the ADC 410 may be set to 125 Mhz and the first baseband signal may be sampled at the sampling rate $f_s$ of 125 Mhz. Referring to FIG. 4, outputs $n_{1,0}$ to $n_{1,15}$, which are sampled at the sampling rate $f_s$ in the ADC 410, may correspond to time-domain outputs of the spuriouses input sequentially to a first channel of the channel extension module 223_1. In an example embodiment of the present disclosure, the time-domain outputs or time-domain data described in relation to the channel extension module 223_1 may refer to outputs or data obtained by temporally accumulating data (frequency component) outputted to each channel over several times. The PPFB 420 filters the time-domain outputs $P_{1,0}$ to $P_{1,15}$ of the spuriouses using the finite impulse response filters, and transmits the same to the Fast Fourier transform module 430. In an example embodiment, the time-domain outputs $P_{1,0}$ to $P_{1,15}$ may be signals obtained by inputting the outputs $n_{1,0}$ to $n_{1,15}$ from the ADC 410 to the PPFB 420. In an example embodiment, the Fast Fourier transform module 430 receives the time-domain outputs of the filtered spuriouses, performs the Fast Fourier transform on the received time-domain outputs, and outputs frequency-domain signals $X_{1,0}$ to $X_{1,15}$ obtained by dividing a band $-f_s/2 \sim +f_s/2$ into 16 bands at equal intervals. In an example embodiment, the frequency band used in the outputs of the channel expansion module 223_1 may be $-125/2$ to $+125/2$ Mhz. When the baseband bandwidth of the compressive sensing receiver 200 is equal to $-f_s/2 \sim +f_s/2$, the channel expansion module 223_1 may output time-domain data of $X_{1,0}$ to $X_{1,15}$ as data to be input to the spurious removal module 223_2.

In another example embodiment, when the baseband bandwidth is smaller than $\pm f_s/2$, the channel extension module 223_1 may select bands corresponding to the baseband bandwidth from among the time-domain data of $X_{1,0}$ to $X_{1,15}$, and output the same as data to be input to the spurious removal module 223_2. For example, the time-domain data $z_{1,1}$ to $z_{1,11}$ as the results obtained by the Fast Fourier transform in the channel extension module 223_1 may include x(0) (direct current (DC) component), x(1) (DC component+$f_p$), x(2)(DC component+$2f_p$), x(3)(DC component+$3f_p$), x(4)(DC component+$4f_p$), x(5)(DC component+$5f_p$), x(11) (DC component$-5f_p$), x(12) (DC component$-4f_p$), x(13) (DC component$-3f_p$), x(14) (DC component$-2f_p$), x(15) (DC component$-f_p$). That is, among the components included in the inputs to the channel expansion module 223_1, the components x(6) to x(10) other than the components x(0), x(1), . . . , x(5), x(11), x(12), . . . , x(15) may be excluded. In an example embodiment, the order of the outputs $z_{1,1}$-$z_{1,11}$ from the channel expansion module 223_1 is independent of the order of 11 components of x(0), x(1), . . . , x(5), x(11), x(12), . . . , x(15). The outputs $z_{1,1}$ to $z_{1,11}$ mean spuriouses classified by frequency bands. Based on this, the spuriouses may be estimated. Each of the time-domain data obtained by accumulating the spurious estimation value that is output to the first channel of the channel expansion module 223_1 over a number of times may include spurious components classified by the frequency bands. The at least one processor 220 may collect frequency-domain data accumulated on the time domain, accumulate spurious estimation values obtained by performing a signal processing for calculating a spurious estimation value for the first channel a plurality of times, and calculate an average of the accumulated spurious estimation values. In the same manner, the at least one processor 220 may calculate an average of the spurious estimation values for the remaining channels. For example, as illustrated in FIG. 4, the values $z_{1,1}$ to $z_{1,11}$, which are output from the ADC 410, the PPFB 420, and the Fast Fourier transform module 430 for the same signals, may be repeatedly output a plurality of times. The at least one processor 220 may average the repeatedly output values to determine the spurious estimation value for the first channel of the channel expansion module 223_1. The estimation of the spurious of the channel expansion module 223_1 may be repeated for the remaining channels as in the first channel.

In an example embodiment, when the spurious estimation values for all the channels of the channel extension module 223_1 are determined, the at least one processor 220 may store the determined spurious estimation values in the spurious estimation value storage memory 223_3 in advance. In an example embodiment, the values obtained by estimating the spuriouses and stored in the spurious estimation value storage memory 223_3 in advance may be used in the process of removing the spuriouses from the baseband signal obtained by mixing the first signal or the calibration signal with the second signal from the local oscillator. The process of removing the spuriouses will be described in detail below with reference to FIG. 5.

Figure 5:
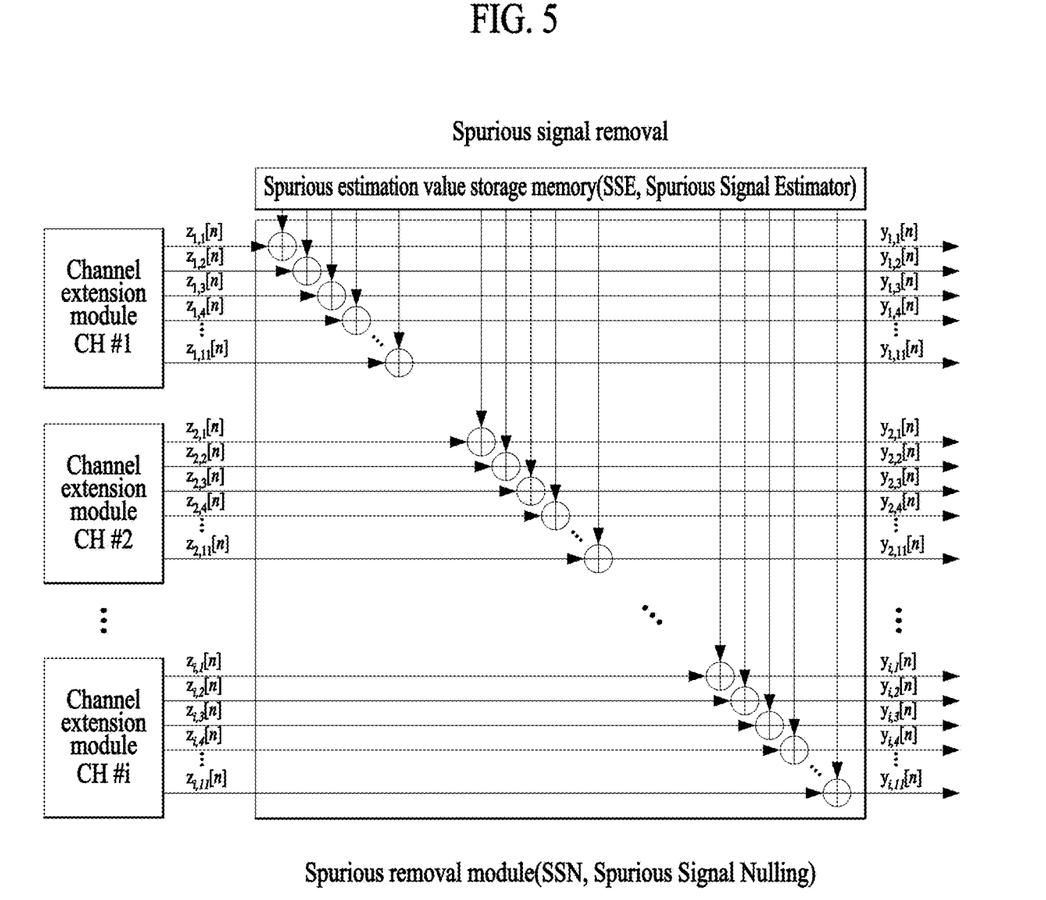
FIG. 5 is a view exemplarily illustrating an operation process of a spurious removal module of the compressive sensing receiver of FIG. 2.

FIG. 5 is a view exemplarily illustrating an operation process of the spurious removal module 223_2 of the compressive sensing receiver 200 of FIG. 2.

Referring to FIG. 5, the spurious removal module 223_2 may perform a process of subtracting the spurious estimation value previously stored in the spurious estimation value storage memory 223_3 from the output value of the channel extension module 223_1. For example, as illustrated in FIG. 5, by subtracting the spurious estimation value from $z_{1,1[n]}$ to $z_{1,11[n]}$ corresponding to outputs of a first channel of the channel extension module, values $y_{1,1[n]}$ to $y_{1,11[n]}$ from which the spurious has been removed may be output. The process of removing the spurious in the spurious removal module 223_2 may be repeated for the remaining channels in the same manner as that performed for the first channel of the channel extension module 223_1. For example, as illustrated in FIG. 5, when outputs of a second channel of the channel extension module is $Z_{2,1[n]}$ to $Z_{2,11[n]}$ and outputs of an i-th channel of the channel extension module is $Z_{i,1[n]}$ to $Z_{i,11[n]}$, outputs after removing the spurious in the spurious removal module 223_2 may be $y_{2,1[n]}$ to $y_{2,11[n]}$ and $y_{i,1[n]}$ to $y_{i,11[n]}$.

Figure 6:
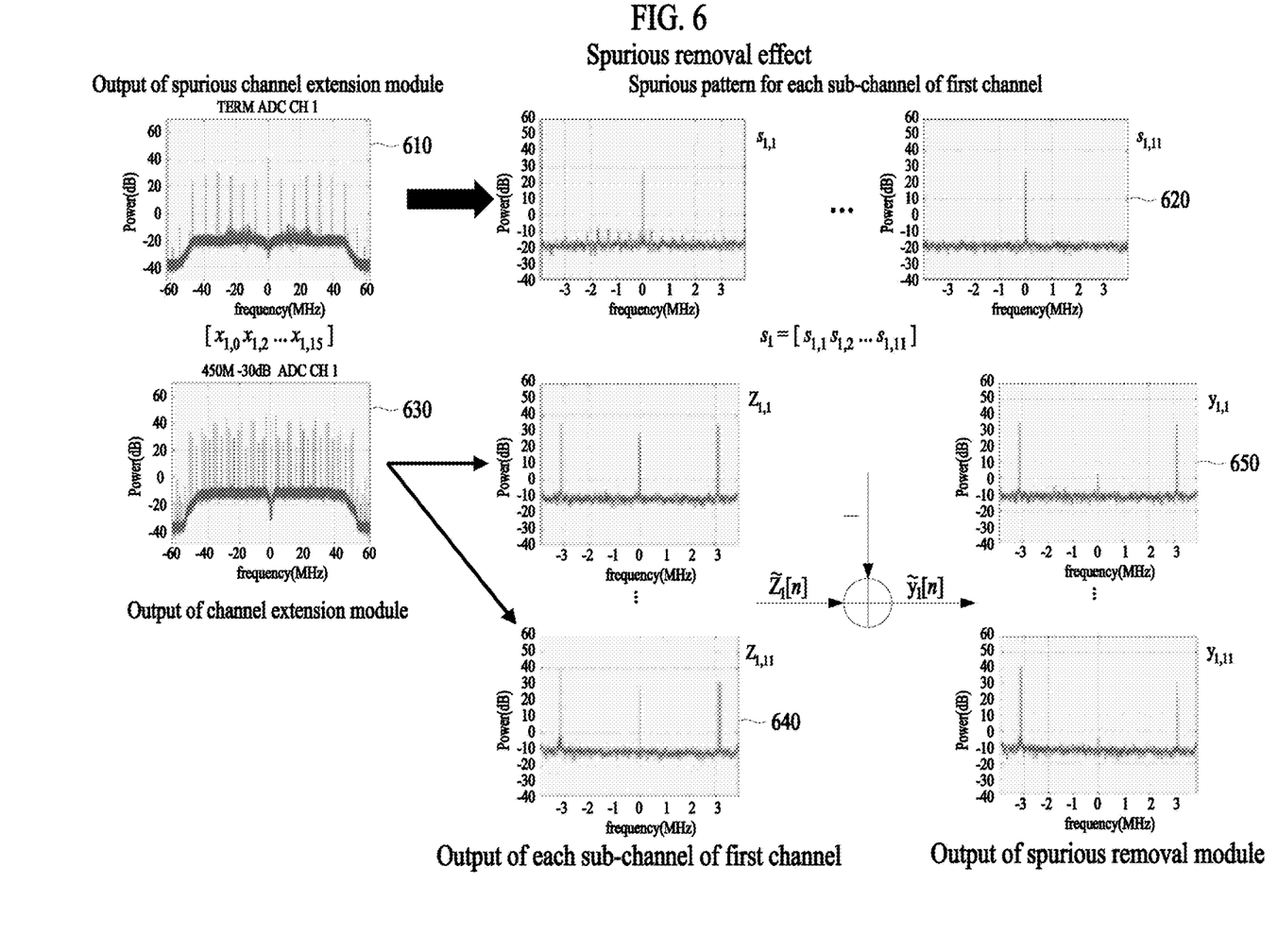
FIG. 6 is a view illustrating a spurious removal effect according to an example embodiment of the present disclosure.

FIG. 6 is a view illustrating a spurious removal effect according to an example embodiment of the present disclosure.

Referring to FIG. 6, reference numeral 610 denotes a result obtained by performing the Fast Fourier transform on the spurious of the first channel of the channel extension module 223_1 in the state in which the signal from the radiofrequency front-end part 221 of FIG. 2 is blocked according to an example embodiment, which is an output of the channel extension module 223_1 for the baseband signal generated based on the second signal (that is, the baseband signal containing the spurious component alone).

Reference numeral 620 denotes spurious patterns $s_{1,1}$, $s_{1,2}$, . . . $s_{1,11}$ for sub-channels of the first channel of the channel extension module 223_1, which are obtained by extracting and averaging bands corresponding to the baseband bandwidth in the compressive sensing receiver 200 according to an example embodiment.

Reference numeral 630 denotes the results $x_{1,0}$, $x_{1,1}$, . . . , $x_{1,15}$ (or $z_{1,1}$ to $z_{1,11}$) obtained by performing the Fast Fourier transform on the first baseband signal generated by mixing the first signal with the second signal (that is, the outputs of the channel extension module 223_1 with respect to the first baseband signal generated by mixing the first signal with the second signal) in a state in which the input from the radio-frequency front-end part 221 of FIG. 2 according to an example embodiment is connected to the channeled reception part 222 (that is, the RF signal input through the receiver 210 or the calibration signal from the calibration signal generation part 224 is input to the channeled reception part 222 through the radio-frequency front-end part 221). For the sake of convenience in description, descriptions will be made hereinafter based on a premise that $z_{1,1}$ to $z_{1,11}$ represent outputs of the channel extension module 223_1.

In an example embodiment, reference numeral 640 denotes outputs $z_{1,1}, z_{1,2}, \ldots, z_{1,11}$ for each sub-channel of the first channel of the channel expansion module 223_1, from which bands corresponding to the baseband bandwidth in the compressive sensing receiver 200 according to an example embodiment are extracted. Here, the outputs $z_{1,1}, z_{1,2}, \ldots, z_{1,11}$ may be calculated based on bands except for bands $x_{1,6}, x_{1,7}, \ldots, x_{1,10}$ that do not correspond to the baseband bandwidth among the outputs $x_{1,0}, x_{1,1}, \ldots, x_{1,15}$. The outputs $z_{1,1}, z_{1,2}, \ldots, z_{1,11}$ for every sub-channels of the first channel may be used as inputs to the spurious removal module 223_2. The spurious removal module 223_2 may remove the spurious from the outputs (for example, 640) for every sub-channels inputted to the spurious removal module 223_2 based on the value (for example, 620) which is obtained by estimating the spurious generated by the local oscillator and is stored in the estimation value storage memory 223_3.

Reference numeral 650 denotes the results $y_{1,1}, y_{1,2}, \ldots, y_{1,11}$ obtained by removing the spurious 620 of the first channel from the sub-channel output 640 of the first channel according to an example embodiment. As a result of comparing the output (for example, 640) before removing the spurious by the spurious removal module 223_2 with then output (for example, 650) after removing the spurious by the spurious removal module 223_2, it may be seen that the spurious in the vicinity of DC are significantly reduced. Thus, according to an example embodiment of the present disclosure, it is possible to improve accuracy of slice detection by detecting a spectral slice based on the output from which the spurious are removed.

Figure 7:
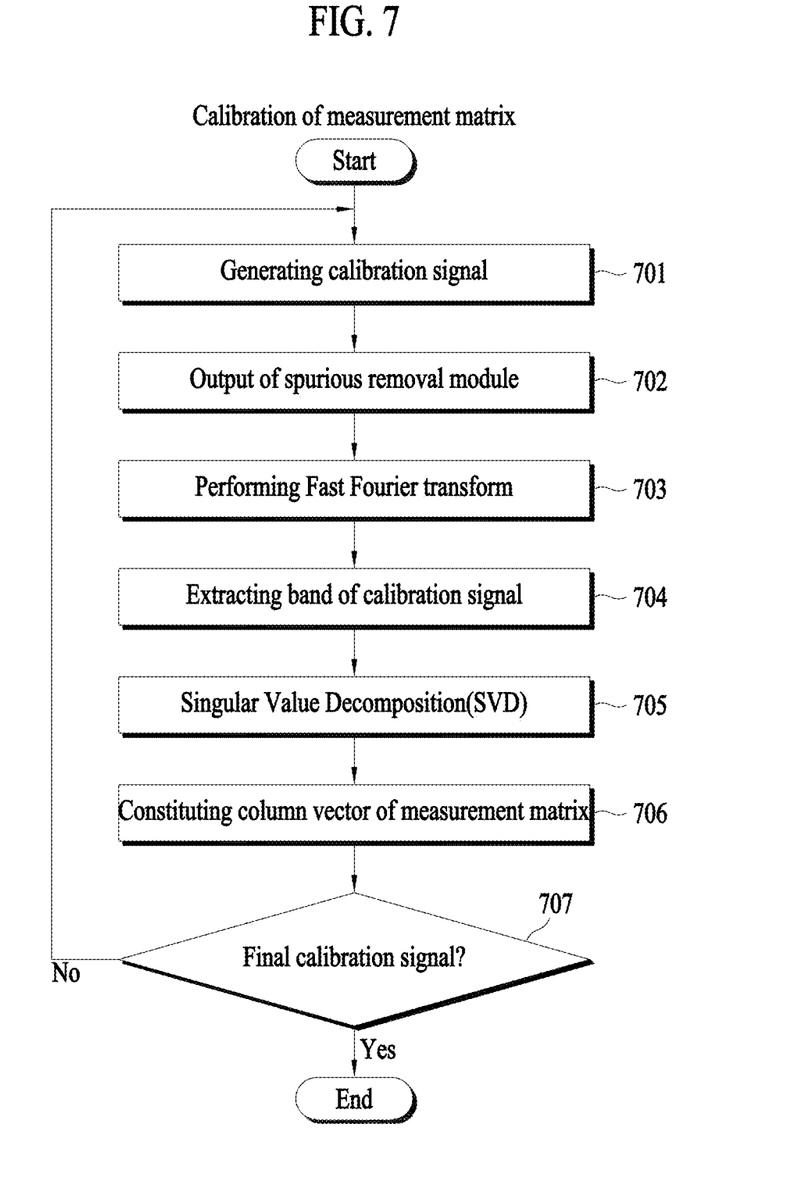
FIG. 7 is a flowchart exemplarily illustrating a measurement matrix calibration procedure according to an example embodiment of the present disclosure.

FIG. 7 is a flowchart exemplarily illustrating a measurement matrix calibration procedure according to an example embodiment of the present disclosure.

The measurement matrix calibration procedure of FIG. 7 may be performed by the compressive sensing receiver 100 of FIG. 1 and the compressive sensing receiver 200 of FIG. 2, and thus description of the contents that overlap with FIGS. 1 and 2 will be omitted.

In an example embodiment, in consideration of the cross modulation distortion generated when mixing the first signal obtained by the receiver 210 with the second signal generated by the local oscillator based on the pseudo random binary sequence, the digital processing part 223 of the compressive sensing receiver 200 may calibrate the measurement matrix based on the second signal to detect the spectral slice.

In Operation 701, the compressive sensing receiver 200 according to example embodiments may generate a calibration signal using the calibration signal generating part 224. In an example embodiment, the radio-frequency front-end part 221 may include the switch configured to selectively receive the first signal obtained by the receiver 210 or the calibration signal generated by the calibration signal generating part 224. For example, when the switch of the radio-frequency front-end part 221 is set to receive the output of the calibration signal generating part 224, the calibration signal generated by the calibration signal generating part 224 may be amplified in the radio-frequency front-end part 221. In this case, the generated calibration signal may be repeatedly generated at a bit pattern length L of the local oscillator based on the pseudo random binary sequence. A frequency of the calibration signal may be set to have an offset shifted by a preset magnitude with respect to a central frequency for each band $f_p$ obtained by dividing a full reception frequency band $\pm f_{max}$ for the first signal by the bit pattern length L of the local oscillator based on the pseudo random binary sequence. Here, the full reception frequency band means a substantially usable frequency band of received signals by the antenna, and may be in a range of 20 to 500 Mhz. The full reception frequency band may correspond to a frequency band that may be utilized from the antenna to the input terminal of the mixer of the channeled reception part 222. As an example of the offset, as illustrated in FIG. 6, the DC components located in the center of the graph, which correspond to $z_{1,1}, z_{1,11}, y_{1,1}, y_{1,11}$, corresponds to the spuriouses, and the impulse signals positioned at left and right sides of the central DC component may correspond to the calibrated test signal shifted by the preset offset. The reason for setting the offset is as follows. Since the spurious is generated at an interval $f_p$ with reference to the DC signal and the spurious of the DC component is generated, the calibration signal may be generated with some offset to accurately remove spurious in a subsequent operation. In an example embodiment, the magnitude of the preset offset may be 100 kHz, or may be one higher or lower than 100 kHz at a certain level.

In Operation 702, the calibration signal generated by the calibration signal generating part 224 of the compressive sensing receiver 200 according to the embodiments is transmitted to the digital processing part 223 via the radio-frequency front-end part 221 and the channeled reception part 222. The radio-frequency front-end part 221 may amplify the calibration signal. The channeled reception part 222 may mix the calibration signal generated by the calibration signal generating part 224 with the second signal generated by the local oscillator based on the pseudo random binary sequence, to generate the second baseband signal. The generated second baseband signal may be converted (that is, sampled) into a digital signal by the ADC 410 of the digital processing part. The second baseband signal, which has been converted into the digital signal, passes through the channel extension module 223_1 and the spurious removal module 223_2 where the spurious may be removed. For example, through the use of the method described with reference to FIG. 5, the at least one processor 220 may remove the spurious by subtracting the spurious estimation value previously stored in the spurious estimation value storage memory 223_3 from the second baseband signal converted into the digital signal. As a result, when the calibration signal is input, the signal from the spurious removal module 223_2 may be outputted in such a manner that the calibration signal from which the spurious is removed is compressed in the baseband.

In Operation 703, the compressive sensing receiver 200 according to example embodiments may perform the Fast Fourier transform on the output of the spurious removal module 223_2. A channel bandwidth and a resolution of the Fast Fourier transform may be calculated through Equation 1 below.

Channel bandwidth=sampling rate/number of channels

Resolution of Fast Fourier transform=channel bandwidth/number of points in Fast Fourier transform  <Equation 1>

In an example embodiment, a sampling rate (or sampling frequency) is denoted as $f_s$ at the time of the Fast Fourier transform and means the number of data measured per second. The number of channels means the number of channels of the channel extension module. The channel bandwidth $f_p$ may be calculated by dividing the number of channels by the sampling rate, and may correspond to a sampling rate for each channel. In an example embodiment, when the sampling rate of the ADC 410 is 125 Mhz and the number of channels of the channel extension module 223_1 is 16, the channel bandwidth may be calculated as 7.8125 Mhz. The resolution of the Fast Fourier transform is denoted as a frequency resolution $f_r$ and means an interval between frequencies in the results of the Fast Fourier transform. The resolution of the Fast Fourier transform is calculated by dividing the channel bandwidth by the number of points of the Fast Fourier transform (for example, M for an M-point Fourier transform). In an example embodiment, when the channel bandwidth is 7.8125 Mhz and the number of points of the Fast Fourier transform is a preset number (for example, 8192), the resolution of the Fast Fourier transform may be calculated as 7.8125/8192 Mhz.

In Operation 704, the compressive sensing receiver 200 according to example embodiments may extract some bands in which the calibration signal presenting at a position shifted by the offset frequency is included using the resolution of the Fast Fourier transform calculated in Operation 703. In an example embodiment, since the offset frequency (for example, the central frequency±100 kHz) of the calibration signal is set the compressive sensing receiver 200 in advance, the compressive sensing receiver 200 may perform a complex Fast Fourier transform on the output of the spurious removal module 430 and subsequently, extract a signal of the frequency band in which the calibration signal presenting at a position shifted by the offset frequency is included using the resolution of the Fast Fourier transform expressed by Equation 1. For example, a signal component of a band in a range −n to +n (for example, the n may be 50 kHz) with reference to the offset frequency (for example, the central frequency±100 kHz) of the calibration signal may be extracted. The extracted frequency band in which the calibration signal is included may have the form of a matrix A having a magnitude of number of channels m extraction bandwidth n.

In Operation 705, the compressive sensing receiver 200 according to example embodiments may perform a singular value decomposition (SVD) on the matrix A of the frequency band extracted in Operation 704. The singular value decomposition may be calculated by Equation 2 below.

$$A = U\Sigma V^T$$

$$UU^T = U^T U = I, VV^T = V^T V = I,$$

$$U^{-1} = U^T, V^{-1} = V^T \qquad \text{<Equation 2>}$$

A: m×n rectangular matrix
U: m×m orthogonal matrix
$\Sigma$: m×n diagonal matrix
V: n×n orthogonal matrix In an example embodiment, the matrix A means a rectangular matrix having the magnitude of the number of channels (m)*extraction bandwidth (n). The matrix U means an orthogonal matrix having a magnitude of number of channels (m)*number of channels (m). The matrix $\Sigma$ means a diagonal matrix having a magnitude of number of channels (m)*extraction bandwidth (n). The matrix V means an orthogonal matrix having a magnitude of extraction bandwidth (n)*extraction bandwidth (n). The matrix $V^T$ means a transposed matrix of the matrix V. The matrix $V^{-1}$ means an inverse matrix of the matrix V.

In Operation 706, the compressive sensing receiver 200 according to an example embodiment may perform the singular value decomposition on the matrix A, and subsequently, select a column vector with the largest singular value to constitute a column vector of the measurement matrix corresponding to the frequency of the generated calibration signal.

In Operation 707, the compressive sensing receiver 200 according to an example embodiment may calibrate the measurement matrix using results obtained by repeatedly performing Operations 701 to 706 on the calibration signal corresponding to the remaining frequencies. In an example embodiment, the measurement matrix which has been subjected to a final calibration may be stored in the measurement matrix storage memory 223_4.

In an example embodiment, the compressive sensing receiver 200 may remove the spurious component from the first baseband signal generated by mixing the first signal and the second signal received by the receiver 210 through the use of the spurious estimation value stored in the spurious estimation value storage memory 223_3, and may detect the spectral slice including the first signal based on the first baseband signal from which the spurious component is removed and the measurement matrix stored in the measurement matrix storage memory 223_4. As a technique of detecting the spectral slice including the first signal using the measurement matrix, compressed sensing techniques in the related art may be used.

In an example embodiment, the compressive sensing receiver 200 may remove the spurious component from the second baseband signal generated by mixing the calibration signal with the second signal through the use of the spurious estimation value stored in the spurious estimation value storage memory 223_3, and may calibrate the measurement matrix based on results obtained by removing the spurious component from the second baseband signal. In an example embodiment, the compressive sensing receiver 200 may detect the spectral slice including the first signal using the first baseband signal from which the spurious component is removed and the calibrated measurement matrix. With such a configuration, the compressive sensing receiver 200 described in the present disclosure may have improved spectral slice detection performance compared to the compressed sensing technique in the related art.

Figure 8:
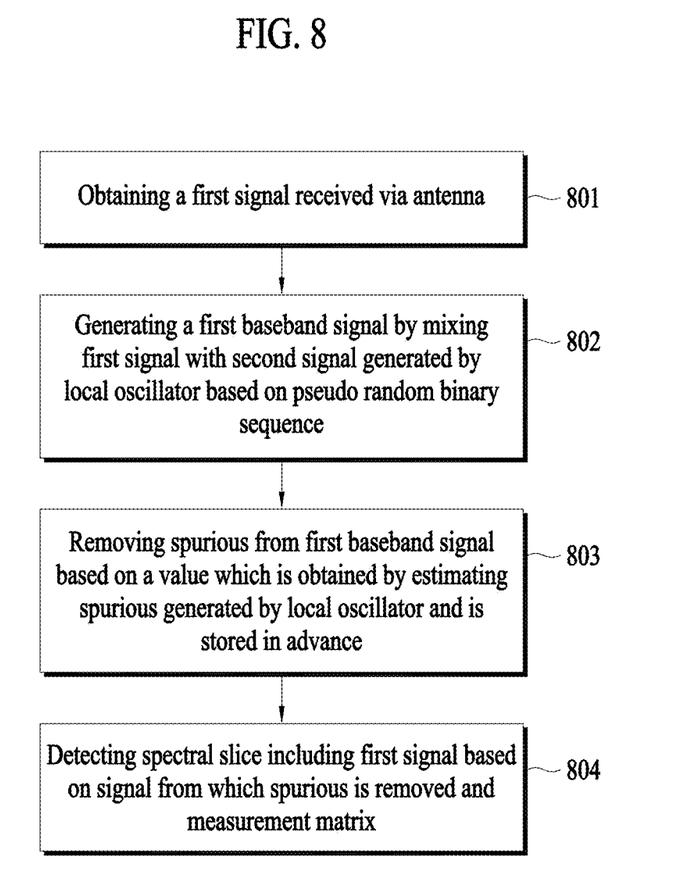
FIG. 8 is a flowchart illustrating a signal processing method performed by the compressive sensing receiver according to an example embodiment of the present disclosure.

FIG. 8 is a flowchart illustrating a signal processing method performed by the compressive sensing receiver 100 according to an example embodiment of the present disclosure.

Respective operations of the signal processing method of FIG. 8 may be performed by the compressive sensing receiver 100 of FIG. 1 and the compressive sensing receiver 200 of FIG. 2, and thus description of the contents that overlap with those of FIGS. 1 and 2 will be omitted.

In Operation 801, the compressive sensing receiver 100 may obtain a first signal received via an antenna. In Operation 802, the compressive sensing receiver 100 may mix the first signal with the second signal generated by the local oscillator based on the pseudo random binary sequence to generate the first baseband signal. In Operation 803, the compressive sensing receiver 100 may estimate a spurious generated by the local oscillator to remove the spurious from the first baseband signal based on a value which is obtained by estimating the spurious generated by the local oscillator and is stored in advance. In Operation 804, the compressive sensing receiver 100 may detect the spectral slice including the first signal based on a signal from which the spurious is removed and the measurement matrix.

The apparatus according to example embodiments described above may include a permanent storage such as a disk drive, a communication port for communication with external devices, user interface devices such as a touch panel, keys, and buttons, and the like. The methods that are implemented as software modules or algorithms may be stored as program instructions or computer-readable codes executable by the processor on a computer-readable recording medium. Here, examples of the computer-readable recording medium may include magnetic storage media (for example, read-only memory (ROM), random access memory (RAM), floppy disk, or hard disk), optically readable media (for example, compact disk read-only memory (CD-ROM) or digital versatile disk (DVD)), and the like. The computer-readable recording medium may be distributed over computer systems connected to each other via a network, and thus, the computer-readable codes may be stored and executed in a distributed fashion. This medium may be read by the computer, stored in the memory, and executed by the processor.

The present example embodiments may be described in terms of functional block components and various processing steps. Such functional blocks may be realized by any number of hardware and/or software components configured to perform specified tasks. For example, embodiments may employ various integrated circuit (IC) components, such as memory elements, processing elements, logic elements, look-up tables, and the like, which may perform a variety of tasks under the control of one or more microprocessors or other control devices. Similar to a case in which the constituent elements are implemented using software programming or software elements, the present example embodiments may be implemented with any programming or scripting language such as C, C++, Java, assembler language, or the like, with the various algorithms being implemented with any combination of data structures, processes, routines or other programming elements. Functional aspects may be implemented in algorithms that are executed on one or more processors. Furthermore, the example embodiments described herein could employ related arts for electronic configuration setting, signal processing and/or data processing and the like. The terms "mechanism," "element," "means," and "configuration" may be used broadly and are not limited to mechanical or physical embodiments. These terms may include meaning of a series of routines of software in association with a processor, for example.

Although in the present specification, preferable example embodiments of the present disclosure have been described with reference to the figures and the specific terms have been used, they are merely specific examples disclosed to easily explain the technical content of the present disclosure and further facilitate overall understanding of the present disclosure, and are not intended to limit the scope of the present disclosure. Further, it will be apparent to those skilled in the art that other variations based on the technical ideas of the present disclosure may be made in addition to the example embodiments disclosed herein.

What is claimed is:

1. A method of processing a signal in a compressive sensing receiver, the method comprising:
    obtaining a first signal received via an antenna;
    generating a first baseband signal by mixing the first signal with a second signal generated by a local oscillator based on a pseudo random binary sequence (PRBS);
    removing a spurious component from the first baseband signal based on a value which is obtained by estimating the spurious component generated by the local oscillator and is stored in advance;
    detecting a spectral slice including the first signal based on the first baseband signal from which the spurious component is removed and a measurement matrix, and
    calibrating the measurement matrix using a calibration signal generated based on a bit pattern length of the pseudo random binary sequence and a reception frequency band.

2. The method of claim 1, wherein the first signal includes a plurality of radio-frequency (RF) signals,
    wherein the value is a spurious component average value obtained by estimating spurious component values generated by the local oscillator and calculating an average thereof, and
    wherein the generating the first baseband signal includes:
    mixing the first signal with the second signal; and
    generating the first baseband signal by filtering the mixed signal using a low-pass filter.

3. The method of claim 2, wherein the calibrating of the measurement matrix includes:
    mixing the calibration signal with the second signal to generate a second baseband signal;
    sampling the second baseband signal;
    filtering the sampled second baseband signal with a finite impulse response filter and performing a Fast Fourier transform on the filtered sampled second baseband signal;
    removing the spurious component from the transformed second baseband signal based on the stored spurious component average value;
    performing the Fast Fourier transform on the second baseband signal from which the spurious component is removed;
    extracting a signal of a frequency band in which the calibration signal is included from the second baseband signal subjected to the Fast Fourier transform; and
    calibrating the measurement matrix based on a result obtained by decomposing a singular value from the extracted signal.

4. The method of claim 3, wherein the detecting of the spectral slice includes:
    detecting the spectral slice based on the first baseband signal from which the spurious component is removed and the calibrated measurement matrix.

5. The method of claim 3, wherein the extracting of the signal of the frequency band in which the calibration signal is included, includes:
    extracting a signal of a frequency band that is shifted by a preset offset from a central frequency of each of bands obtained by dividing a reception frequency band for the first signal by a predetermined bit pattern length of the pseudo random binary sequence.

6. A compressive sensing receiver of processing a signal, comprising:
    a receiver configured to obtain a first signal received via an antenna;
    a memory storing a spurious component estimation value and a measurement matrix; and
    at least one processor configured to perform: generating a first baseband signal by mixing the first signal with a second signal generated by a local oscillator based on a pseudo random binary sequence; removing a spurious component from the first baseband signal based on the spurious component estimation value which is obtained by estimating the spurious component generated by the local oscillator and is stored in advance; detecting a spectral slice including the first signal based on the first baseband signal from which the spurious component is removed and the measurement matrix; and calibrating the measurement matrix using a calibration signal generated based on a bit pattern length of the pseudo random binary sequence and a reception frequency band.

7. The compressive sensing receiver of claim 6, wherein the first signal received by the receiver includes a plurality of radio frequency (RF) signals,
wherein the spurious component estimation value is a spurious component average value obtained by estimating spurious component values generated by the local oscillator and calculating an average thereof, and
wherein the at least one processor is configured to perform:
mixing the first signal with the second signal; and
generating the first baseband signal by filtering the mixed signal using a low-pass filter.

8. The compressive sensing receiver of claim 7, wherein the at least one processor is configured to perform:
mixing the calibration signal with the second signal to generate a second baseband signal;
sampling the second baseband signal;
filtering the sampled second baseband signal with a finite impulse response filter and performing a Fast Fourier transform on the filtered sampled second baseband signal;
removing the spurious component from the transformed second baseband signal based on the stored spurious component average value;
performing the Fast Fourier transform on the second baseband signal from which the spurious component is removed;
extracting a signal of a frequency band in which the calibration signal is included from the second baseband signal subjected to the Fast Fourier transform; and
calibrating the measurement matrix based on a result obtained by decomposing a singular value from the extracted signal.

9. The compressive sensing receiver of claim 8, wherein the at least one processor is configured to detect the spectral slice including the first signal based on the first baseband signal from which the spurious component is removed and the calibrated measurement matrix.

10. The compressive sensing receiver of claim 8, wherein the at least one processor is configured to extract a signal of a frequency band that is shifted by a preset offset from a central frequency of each of bands obtained by dividing a reception frequency band for the first signal by a predetermined bit pattern length of the pseudo random binary sequence.

11. A non-transitory computer-readable storage medium storing instructions, wherein when the instructions are performed by at least one of processor included in a compressive sensing receiver, the compressive sensing receiver is caused to execute:
obtaining a first signal received via an antenna;
generating a first baseband signal by mixing the first signal with a second signal generated by a local oscillator based on a pseudo random binary sequence (PRBS);
removing a spurious component from the first baseband signal based on a value which is obtained by estimating the spurious component generated by the local oscillator and is stored in advance;
detecting a spectral slice including the first signal based on the first baseband signal from which the spurious component is removed and a measurement matrix; and
calibrating the measurement matrix using a calibration signal generated based on a bit pattern length of the pseudo random binary sequence and a reception frequency band.

* * * * *